United States Patent [19]

Breuer et al.

[11] 3,737,742

[45] June 5, 1973

[54] MONOLITHIC BI-POLAR SEMICONDUCTOR DEVICE EMPLOYING CERMET FOR BOTH SCHOTTKY BARRIER AND OHMIC CONTACT

[75] Inventors: David R. Breuer, Malibu; James L. Buie, Panorama City, both of Calif.

[73] Assignee: TRW Inc., Redondo Beach, Calif.

[22] Filed: Sept. 30, 1971

[21] Appl. No.: 185,137

[52] U.S. Cl.........317/235 R, 317/234 M, 317/234 N, 317/235 D, 317/235 E, 317/235 U, 317/235 AC

[51] Int. Cl. ......................H01l 11/00, H01l 15/00

[58] Field of Search.........................317/234, 235, 22, 317/31, 42, 5, 5.4

[56] References Cited

UNITED STATES PATENTS

| | | | |
|---|---|---|---|
| 3,178,804 | 4/1965 | Ullery et al. | 317/234 |
| 3,263,095 | 7/1966 | Fang | 317/235 |
| 3,472,688 | 10/1969 | Hayashi et al. | 317/234 |
| 3,497,774 | 2/1970 | Hornberger et al. | 317/234 |
| 3,508,125 | 4/1970 | Ertel et al. | 317/235 |
| 3,513,366 | 5/1970 | Clark | 317/235 |
| 3,559,003 | 1/1971 | Beaudouin et al. | 317/235 |
| 3,569,800 | 3/1971 | Collins | 317/234 |

OTHER PUBLICATIONS

Electronics Review; Thin-Film Cermet Solves Resistor Problems; Oct. 26, 1970, pp. 39–41.

*Primary Examiner*—John W. Huckert
*Assistant Examiner*—Andrew J. James
*Attorney*—Daniel L. Anderson, Jery A. Dinardo and Harry I. Jacobs

[57] ABSTRACT

A layer of cermet material, deposited in a single processing step, connects the base and collector regions of a bipolar transistor to form a Schottky barrier diode therebetween; makes ohmic contact to highly doped shallow diffused regions such as the emitter and collector contact areas; provides a barrier by preventing the interaction of contact metal and the shallow diffused semiconductor regions; and produces a thin film resistor of low parasitic capacitance for connection to the transistor.

16 Claims, 4 Drawing Figures

David R. Breuer
James L. Buie
*INVENTORS*

BY

AGENT

MONOLITHIC BI-POLAR SEMICONDUCTOR DEVICE EMPLOYING CERMET FOR BOTH SCHOTTKY BARRIER AND OHMIC CONTACT

BACKGROUND OF THE INVENTION

1. Field of the Invention

This invention relates to improvements designed to increase the operating speed of large scale monolithic bipolar transistor circuits while minimizing production costs thereof.

2. Description of the Prior Art

The need is ever present for improving the high speed performance of integrated circuits. One such digital data processing circuit having high speed performance characteristics is the parallel digital correlator disclosed in a paper presented by the inventors herein at the 1970 Government Microcircuit Application Conference at Forth Monmouth, New Jersey, October 6–8, 1970, and entitled "A High Speed, High Complexity LSI Correlator". Digital correlation is well suited for large scale integration (LSI) because of the highly repetitive nature of the correlation function and the relatively few package interconnections required.

The high speed performance requirements of the digital correlator made it desirable to employ a Schottky barrier diode clamp across each transistor to increase the switching speed of the transistors. The incorporation of a Schottky barrier diode clamp shunting the base and collector junction of a transistor is disclosed in U. S. Pat. No. 3,463,975 to James Robert Biard, issued Aug. 26, 1969.

It was decided to employ thin film resistors in the correlator because thin films exhibit improved accuracy and stability characteristics as compared to silicon resistors. In addition, they provide lower parasitic capacitance than diffused silicon resistors. This improves the switching speed in circuits where they are used.

Further, the high speed requirements of integrated circuits dictate the use of shallow diffusion depths and hence the problem of preventing the interaction of metal and the silicon semiconductor becomes more critical. Such a problem arises in connection with the evaporated metal layer provided for making ohmic contact to the emitter region. If the metal interacts with the emitter semiconductor region, it may short circuit the emitter base junction. However, according to the invention, the thin film resistive material acts as a barrier preventing this problem.

SUMMARY OF THE INVENTION

In accordance with the invention, a cermet material is used in an integrated bipolar circuit to serve the following four functions simultaneously; one to make contact to heavily doped N+ and P+ regions; two, to make Schottky barrier diode contact to a lightly doped N region; three, to provide a barrier against interaction of the silicon and the highly conductive metal that is used to interconnect with the region where ohmic contact is made; and four, to make thin film resistors. The cermet film is laid down in a single flash evaporation step and a single sintering step to provide all of the four desired functions. The cermet film is arranged on such surface areas of the base and collector regions as to place the Schottky barrier diode in shunt with the base and collector junction.

While it has been taught in U. S. Pat. No. 3,559,003 to P. L. Beaudouin et al., issued Jan. 26, 1971, to use cermet material for making ohmic contact, there is no teaching in the patent to suggest that Schottky barrier diode contact can be made with the same cermet material.

DESCRIPTION OF THE PREFERRED EMBODIMENTS

Figure 1:
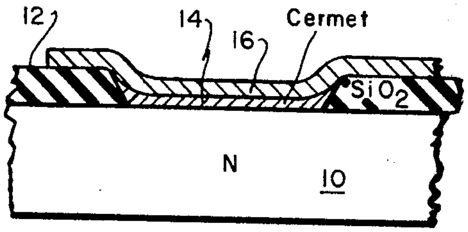
FIG. 1 is a sectional view of a cermet layer deposited on a lightly doped semiconductive surface and forming a Schottky barrier diode therewith.

Referring now to FIG. 1 there is shown a preferred way of making a Schottky barrier diode according to one aspect of the invention. A body 10 of N type semiconductor, such as silicon, is lightly doped to have a concentration of $8.5 \times 10^{16}$ atoms/cm$^3$ or less, which is equivalent to a resistivity equal to or greater than 0.1 ohm-cm. On the surface of the semiconductor body 10 is deposited a passivating layer 12 of silicon dioxide $SiO_2$ having an opening therein which is formed by conventionally known photoresist masking and hydrofluoric acid etching techniques. The layer 12 of silicon dioxide is typically about 8,000 angstroms thick.

A layer 14 of cermet material is deposited to cover the surface of the silicon body 10 exposed through the opening in the oxide layer 12. The cermet layer 14 is preferably formed by flash evaporating in vacuum a mixture of chromium and silicon monoxide to cover the oxide layer 12 as well as the exposed surface of the silicon body 12. The proportions by weight of the constituents of the cermet mixture may vary in the range of 65 to 50 percent for chromium and 35 to 50 percent for silicon monoxide. The excess cermet material is selectively etched away from the oxide layer 12. Typically, a cermet layer 14 consisting of 58% chromium and 42% silicon monoxide about 300 angstroms thick has a specific resistivity of $3 \times 10^{-3}$ ohm-cm, thereby providing a sheet resistance of 1000 ohms per square. A cermet mixture of silicon and chromium has also been successfully used. With this mixture, the proportions by weight may vary in the range of 60 to 40 percent for silicon and 40 to 60 percent for chromium.

A final layer 16 of contact metal is deposited on the cermet layer 14 to provide interconnection with other components that might be formed within the silicon body 10. The metal contact layer 16 may comprise aluminum if it is vacuum deposited following the cermet deposition without breaking the vacuum. If it is desired to break the vacuum after the cermet deposition, then a layer of oxide would form on the cermet that prevents a subsequent layer of aluminum from making good contact to the cermet. In that case, it is preferred to vacuum deposit a layer of titanium, which may be 600 angstroms thick, over the oxidized cermet prior to vacuum depositing a layer of aluminum, which may be 6,500 angstroms thick.

The deposited cermet layer 14 and metal layer 16 are sintered by heating at a temperature of 450°C for 20 minutes. The cermet layer 14 is found to make a Schottky or surface barrier contact with the surface of the lightly doped N type silicon body 10. The Schottky diode barrier heights for silicon monoxide-chrome cermet is 0.60 to 0.62 volts. The reverse breakdown voltage is typically greater than 20 volts.

In a structure such as that shown in FIG. 1, the effects of tunneling through the oxide layer 12 from the outer peripheral regions of the cermet layer 14 and/or metal layer 16 are likely to occur. Tunneling manifests itself as leakage current and low breakdown voltage of the Schottky barrier diode, which causes deterioration in the reverse direction characteristics.

Figure 2:
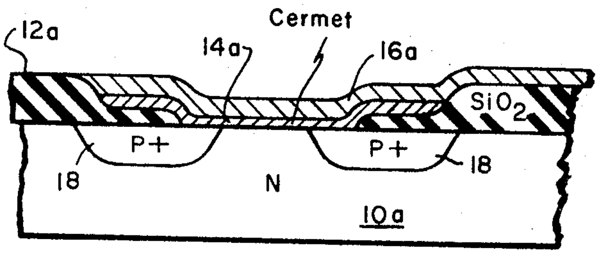
FIG. 2 is a sectional view of a cermet layer deposited on a lightly doped semiconductor region of one conductivity type surrounded by a heavily doped semiconductor region of opposite conductivity type and forming a Schottky barrier diode shunted by a P-N junction diode.

The modified structure of FIG. 2 is designed to overcome these tunneling effects. As shown in this modified embodiment, a P+ region 18 in the form of a ring is formed within the N type silicon body **10*a* by a P+ diffusion. The P+ region 18 is a base diffusion resulting from a boron diffusion having a concentration of about $5 \times 10^{18}$ atoms/cm$^3$ or greater. The outer periphery of the P+ region 18 may extend beyond the outer peripheral regions of the cermet layer 14*a* and contact metal layer 16*a*. The opening in the oxide layer 12*a* exposes an inner annular portion of the P+ region 18 as well as the surface portion of the N type silicon body 10*a* enclosed within the ring-like P+ region 18. Thus the cermet layer 14*a* covers the inner N type surface region and a ring-like portion of the P+ region 18. The cermet layer makes a Schottky barrier contact with the N type region and ohmic contact with the P+ region 18. The result is that a P-N junction diode formed at the junction of the P+ region 18 and the N type body 10*a*** is placed in parallel with the Schottky diode.

Figure 3:
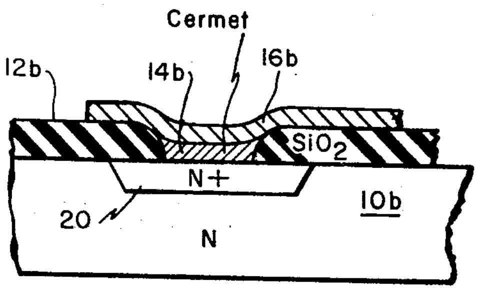
FIG. 3 is a sectional view of a cermet layer deposited on a heavily doped shallow diffused region making ohmic contact therewith and providing a barrier against diffusion of contact metal deposited on the cermet layer.

FIG. 3 illustrates another aspect of the invention wherein a cermet layer is provided to make ohmic contact to a shallow diffused emitter region. At the same time, the cermet layer serves as a diffusion barrier for preventing the contact layer metal from diffusing through the shallow emitter region and short circuiting the same. Referring now to FIG. 3, an N+ region 20 of shallow depth Is diffused into the N type silicon body **10*b* to form an emitter region. The N+ region 20 is formed by an emitter diffusion such as by diffusing phosphorous or arsenic with a concentration level of at least $5 \times 10^{18}$ atoms/cm$^3$, and preferably about $10^{20}$ atoms/cm$^3$ or greater, the diffusion being effected through the opening in the oxide layer 12*b*. The cermet layer 14*b* is deposited on the exposed surface of the N+ emitter region 20 to make ohmic contact therewith. When the contact metal layer 16*b* is deposited on the cermet layer 14*b*, it is preVented from interacting with the N+ emitter region 20 by the presence of the cermet layer 14*b*, thereby preventing short circuits in the emitter region 20.**

Figure 4:
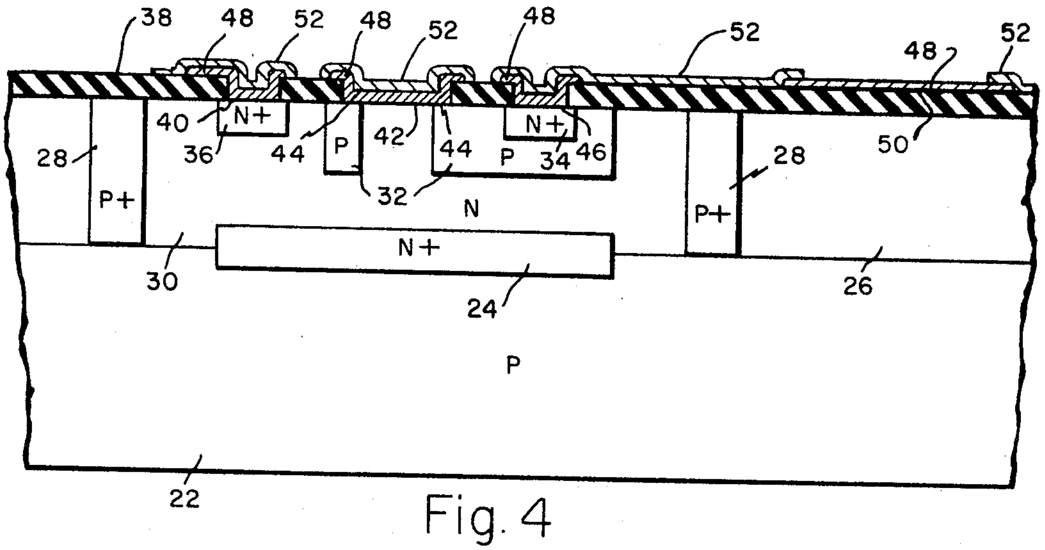
FIG. 4 is a sectional view of a portion of a monolithic circuit employing a cermet layer according to the invention.

Referring now to FIG. 4, there is shown a complete integrated circuit device incorporating a bipolar transistor that is shunted across its base and collector junction by a cermet layer forming a Schottky diode. The monolithic device includes a substrate 22 of P type material of very high resistivity, such as silicon, and a buried layer 24 of heavily doped N+ type material of very low resistivity diffused therein. A layer 26 of N type material of high resistivity is epitaxially grown on the substrate 22. During growth of the epitaxial layer 26, there occurs some unavoidable diffusion of the buried layer 24 into the epitaxial layer 26. The epitaxial layer 26 is lightly doped with a concentration of $8.5 \times 10^{16}$ atoms/cm$^3$ or less.

A collector isolation region 28 of annular shape is formed in the epitaxial layer 26. This region 28 is of P+ type material and is formed by diffusing a heavy concentration of P type impurity atoms, such as boron. The P+ type isolation region 28 extends the entire depth of the epitaxial layer 26 and serves to isolate the collector region of the transistor within it confines from the collector regions of other transistors external to it. The portion of the N type epitaxial layer 26 surrounded by the P+ type isolation region 28 constitutes the collector region 30 of a transistor. Subsequent diffusions into the N type collector region 30 are performed to produce the other elements of the transistor such as the base and the emitter as well as the collector contact region, which will now be described.

An annular asymmetrical base region 32 is formed by diffusing a heavy concentration of P type impurity atoms, about $5 \times 10^{18}$ atoms/cm$^3$ or greater, within the collector region 30. After the base region is formed, another diffusion step is performed with N type impurity atoms to produce two separate shallow diffused regions. One of the shallow regions is formed in the larger portion of the base region 32 to produce the N+ type emitter area 34. The other shallow region is produced within the collector region 30 adjacent to the base region 32 to form the N+ type collector contact area 36. Both areas 34 and 36 are heavily doped with a concentration of at least $5 \times 10^{18}$ atoms/cm$^3$.

After the final diffusion step, a passivating oxide layer 38 is deposited over the epitaxial layer 26. By photoresist masking and acid etching techniques, apertures are formed in the oxide layer 38 to expose a surface area portion 40 over the collector contact area 36, a surface area portion 42 of the collector region 30 surrounded by an annular surface area portion 44 of the base region 32, and a surface area portion 46 over the emitter area 34.

In accordance with the invention, a layer 48 of cermet material is deposited over the oxide layer 38 and through the apertures thereof. The cermet layer 48 covers the surface area portion 40 of the collector contact area 36, the surface area portion 42 of the collector region 30, the adjacent annular surface area portion 44 of the base region 32, the surface area portion 46 of the emitter area 34, and an area 50 on the oxide layer 38 spaced from the emitter area 34. A layer 52 of contact metal is deposited on the cermet layer 48 and portions of the oxide layer 38 to provide conductive contact with the cermet and interconnection between other components of the monolithic structure.

As described previously in connection with the embodiments of FIGS. 1–3, the cermet layer 48 makes ohmic contacts to the collector contact area 36 at the surface area portion 40, to the base region 32 at the annular surface area portion 44, and to the emitter area 34 at the surface area portion 46. At the same time, the cermet layer 48 makes a Schottky barrier diode contact to the collector 30 at the surface area portion 42. By extending over the base-collector junction, the cermet layer 48 places the Schottky barrier diode in shunt with the base-collector junction, the base serving as the anode and the collector serving as the cathode of the diode. The Schottky diode improves the high speed performance of the transistor.

The cermet layer 48 also provides a barrier by preventing the interaction of contact metal with the shallow diffused heavily doped regions as the N+ collector contact area 36 and the N+ emitter area 34.

Finally, the cermet layer 48 provides thin film resistors with low parasitic capacitance. Such a resistor is shown formed on the surface area 50 by selective removal of the contact metal layer 52 from a region of the cermet layer 48.

What is claimed is:

1. A monolithic semiconductor device, comprising:

a. a body of semiconductor having a lightly doped region defining a collector, a first heavily doped region defining a base, and a second heavily doped region defining an emitter;

b. said base and collector regions being contiguous with each other and said emitter region being contiguous with a portion of said base region;

c. a first coating of cermet material on contiguous surface areas of said base and collector regions forming Schottky barrier contact with said collector region and ohmic contact with said base region;

d. a second coating of cermet material on a surface of said emitter region forming ohmic contact therewith;

e. a heavily doped region in said collector region defining a contact area; and f. a third coating of cermet material on said collector contact area forming ohmic contact therewith.

2. The invention according to claim 1, wherein said cermet material consists of 65 to 50% chromium and 35 to 50% silicon monoxide by weight.

3. The invention according to claim 2, wherein said cermet material consists essentially of 58% chromium and 42% silicon monoxide.

4. The invention according to claim 1, wherein said cermet material consists essentially of 60 to 40% silicon and 40 to 60% chromium by weight.

5. The invention according to claim 4, wherein said cermet material consists essentially of 50% silicon and 50% chromium.

6. The invention according to claim 1, wherein said lightly doped regions have an impurity concentration of $8.5 \times 10^{16}$ atoms/cm$^3$ or less.

7. The invention according to claim 6, wherein said heavily doped regions have an impurity concentration of $5 \times 10^{18}$ atoms/cm$^3$ or greater.

8. The invention accOrding to claim 1, and further including a layer of contact metal on said cermet coatings, said metal layer forming a common contact to said collector and base regions and separate contacts to said emitter region and said collector contact area.

9. The invention according to claim 8 and further including a passivating oxide layer on a surface of said semiconductor body;

said oxide layer being formed with openings defining the regions of said semiconductor body where said cermet coatings and said contact metal layers are deposited.

10. The invention according to claim 9 and further including a fourth coating of cermet material on said oxide layer and spaced from said first, second, and third cermet coatings; and a layer of contact metal joining said fourth cermet coating and one of said contact metal layers on the first three mentioned cermet coatings;

said fourth cermet coating functioning as a thin film resistor in circuit with said monolithic semiconductor device.

11. The invention according to claim 10, wherein said cermet coatings consist essentially of a mixture of chromium and silicon monoxide about 300 angstroms thick with a specific resistivity of $3 \times 10^{-3}$ ohm-cm.

12. A microelectronic integrated circuit, comprising:

a. a body of semiconductor material including a collector region of a first conductivity type;

b. an annular base region of the opposite conductivity type from said first type diffused in said collector region and surrounding an inner collector region of said first conductivity type;

c. an emitter region of said first conductivity type diffused in a portion of said annular base region;

d. a layer of cermet material on at least a surface portion of said inner collector region and extending to opposite adjacent surface portions of said annular base region;

e. said cermet material forming a Schottky barrier contact with said inner collector region and ohmic contact with said annular base region; and f. a layer of conductive material on said cermet material.

13. The invention according to claim 12 and further including a layer of cermet material on said emitter region; and a layer of conductive material on said last-mentioned cermet layer.

14. The invention according to claim 13, and further including a heavily doped collector contact region diffused in said collector region; and a layer of cermet material followed by a layer of conductive material deposited on said collector contact region.

15. The invention according to claim 14, wherein said cermet layer consists essentially of 65 to 50% chromium and 35% to 50% silicon monoxide by weight.

16. The invention according to claim 14, wherein said cermet layer consists essentially of 60 to 40% silicon and 40 to 60% chromium by weight.

* * * * *